US012796525B2

(12) United States Patent
Ramalingam

(10) Patent No.: US 12,796,525 B2
(45) Date of Patent: Nov. 10, 2026

(54) SEMICONDUCTOR DEVICE AND A METHOD OF ASSEMBLING A SEMICONDUCTOR DEVICE

(71) Applicant: NEXPERIA B.V., Nijmegen (NL)

(72) Inventor: Vegneswary Ramalingam, Seremban (MY)

(73) Assignee: Nexperia B.V., Nijmegen (NL)

( * ) Notice: Subject to any disclaimer, the term of this patent is extended or adjusted under 35 U.S.C. 154(b) by 434 days.

(21) Appl. No.: 18/241,022

(22) Filed: Aug. 31, 2023

(65) Prior Publication Data

US 2024/0079283 A1 Mar. 7, 2024

(30) Foreign Application Priority Data

Sep. 5, 2022 (EP) .................................... 22193880

(51) Int. Cl.

| | |
|---|---|
| ***H10W 74/10*** | (2026.01) |
| ***H10W 42/00*** | (2026.01) |
| ***H10W 70/20*** | (2026.01) |
| ***H10W 72/00*** | (2026.01) |

(Continued)

(52) U.S. Cl.

CPC .......... *H10W 74/111* (2026.01); *H10W 42/00* (2026.01); *H10W 70/24* (2026.01); *H10W 72/071* (2026.01); *H10W 74/014* (2026.01); *H10W 72/20* (2026.01)

(58) Field of Classification Search

CPC ... H10W 74/111; H10W 42/00; H10W 70/24; H10W 72/071; H10W 74/014; H10W 72/20; H10W 46/101; H10W 46/106; H10W 72/0198; H10W 46/00; H10W 46/103; H10W 46/401; H10W 46/607; H10W 72/01961; H10W 72/926; H10W 72/9413; H10W 72/944; H10W 72/952;

(Continued)

(56) References Cited

U.S. PATENT DOCUMENTS

| | | | | |
|---|---|---|---|---|
| 2002/0015654 | A1 | 2/2002 | Das et al. | |
| 2010/0044885 | A1* | 2/2010 | Fuergut ................ | H10W 70/60 257/784 |
| 2016/0361843 | A1 | 12/2016 | Xiao | |

OTHER PUBLICATIONS

"What is Sintered Metal?.", Posted by Horizon Technology—Apr. 27, 2020, https://www.horizontechnology.biz/blog/what-is-sintered-metal#:~:text=Metal%20is%20stubborn%2C%20and%20sintering,to%20a%20harder%2C%20stronger%20part. (Year: 2020).*

* cited by examiner

*Primary Examiner* — Tucker J Wright
(74) *Attorney, Agent, or Firm* — Ruggiero McAllister & McMahon LLC

(57) ABSTRACT

A semiconductor assembly device is provided including a metal layer, a first metal plate, a second metal plate, a metal pillar, an encapsulant, and a die structure having a first terminal and a second terminal, the first terminal of the die structure is in electrically contact with the metal layer, the metal pillar is in electrical contact with the metal layer, and the second terminal of the die is in contact with the first metal plate and the metal pillar is in contact with the second metal plate and where between the die and the metal pillar and between the first metal plate and the second metal plate the encapsulant is provided, and at least one of the metal layer, the first metal plate or the second metal plate are made of a sintered metal powder. The disclosure also pertains to a method for manufacturing such semiconductor assembly device.

20 Claims, 3 Drawing Sheets

(51) Int. Cl.
*H10W 74/01* (2026.01)
*H10W 72/20* (2026.01)

(58) Field of Classification Search
CPC . H10W 20/43; H10W 20/4421; H10W 74/01; H10W 74/127
See application file for complete search history.

SEMICONDUCTOR DEVICE AND A METHOD OF ASSEMBLING A SEMICONDUCTOR DEVICE

CROSS-REFERENCE TO RELATED APPLICATIONS

This application claims the benefit under 35 U.S.C. § 119(a) of European Application No. 22193880.6 filed Sep. 5, 2022, the contents of which are incorporated by reference herein in their entirety.

BACKGROUND

1. Field of the Disclosure

The present disclosure relates to a high power semiconductor device in a form of stacked layers. A described method of assembling this device can be applied to form interconnections using variety of sinter-able grades of metal powder.

2. Description of the Related Art

Numerous methods of manufacturing layer wise structures are known in the state of the art, including laser sintering fabrication. Such methods are suitable for creating semiconductor devices, but most of them are complex and require post treatment processes.

The most common type of manufacturing powder-based structures is Selective Laser Sintering (SLS) that creates three-dimensional freeform objects directly from their CAD models. The object is created by selectively fusing thin layers of a powder with a scanning laser beam. Each scanned layer represents a cross section of the object's mathematically sliced CAD model.

An example of a method for using a directed beam of energy to selectively sinter metal powder to produce a part is disclosed in US2002/015654. This disclosure discloses a Solid Freeform Fabrication (SFF) method which comprises sequentially depositing layers of metal powder into a chamber with partial pressure atmosphere. Once a layer of powder is deposited, a scanning laser beam selectively fuses the layer into the desired shape. The process continues until a nonporous or fully dense part is completely fabricated, layer by layer. Disclosed method is destined for one direction growth of objects and it requires postprocessing to allow the produced part and leftover powder to cool under vacuum. The method is intended for powders of particles with diameters 10-100 μm made of Copper, Nickel and Cobalt base superalloys, superalloy cermet's, Titanium base alloys and monolithic high temperature metals such as Molybdenum.

Another prior art document no. US2016361843 discloses a laser sintering apparatus and method intended for manufacturing devices based on glass cement, preferably OLED display devices. An object of this disclosure is to provide a method, so as to prevent the occurrence of cracks or breakages in a cement due to a large shrinkage stress generated while sintering with laser beam. The document discloses an apparatus comprising three laser heads configured to sinter the cement with certain configuration of trajectory, speed, and laser power level.

US 2010/044885 A1 discloses a semiconductor device and manufacturing method, wherein a dielectric material is applied to at least two semiconductor chips to attach the at least two semiconductor chips to each other and wherein a portion of the dielectric material is selectively removed between the at least two semiconductor chips to form at least one recess in the dielectric material.

Accordingly, it is a goal of the present disclosure to provide an improved method for laser sintering of metal materials intended for semiconductor devices. The method should allow sintering as an alternative option to form interconnects, eliminating the use of leadfree solder attach material, suitable for electronics, therefore eliminating a post treatment process associated to solder applications.

SUMMARY

As a first example, a semiconductor device is proposed as outlined in claim 1. The semiconductor device comprises a metal layer, a first metal plate, a second metal plate, a metal pillar, an encapsulant, and a die with a first terminal and a second terminal. The first terminal of the die is in contact with the metal layer. The metal pillar is in contact with the metal layer. The second terminal of the die is in contact with the first metal plate. The metal pillar is in contact with the second metal plate. Between the die and the metal pillar and between the first metal plate and the second metal plate there is the encapsulant. The metal layer, the first metal plate and the second metal plate are made of a sintered metal powder.

Preferably the pillar is made of a sintered copper, silver, gold, or stainless steel powder.

Preferably the pillar is made of a sintered metal powder.

Preferably at least one of the metal layer, the first metal plate or the second metal plate are made of copper, copper with additives, silver, brass, aluminum, or carbon nanotubes.

Furthermore, the disclosure proposes a method of assembling a semiconductor device such as defined in claim 5. In a first step a) a layer of a metal powder is provided on a semiconductor device assembly, with the semiconductor device assembly comprising a base with at least one perforation, at least one die with a first terminal and a second terminal, at least one metal pillar, and an encapsulant. The first terminal of the die is in contact with the base, the metal pillar is in contact with a base and the encapsulant is between the metal pillar and the die. The encapsulant is in the at least one perforation in the base. Additionally, the layer of a metal powder is provided in a way that it is in contact with the second terminal of the die, the metal pillar and the encapsulant.

A further step b) comprises sintering, with a laser, the layer of the metal powder to form a metal layer.

Preferably step a) and b) are performed multiple times alternately such that the formed sintered metal becomes thicker after every iteration.

Preferably the metal pillar is made during a step a0), which is performed before step a). The layer of the metal powder is provided on the base and the layer of the metal powder is sintered, preferably this step is performed multiple times to obtain the metal pillar with a height similar to a height of the die.

Preferably during step b) the laser sinters the metal powder such that it forms a letter, number, symbol, or pattern and after this step b) a step c) is performed, during which step an excessive metal powder is removed from the semiconductor device assembly.

It is preferred that the base is a mainframe and preferably the base is a mainframe and a carrier.

After the last sintering step b) related to the metal layer, a step e) is performed during which the carrier is removed and the semiconductor device assembly is turned upside down. After step e), during step f) a layer of a metal powder is provided, such that the metal powder is provided on the second terminal of the die, on the pillar and on the encapsulant. After this step f) a step g) is performed during which a laser is sintering the layer of the metal powder to form a first metal plate and a second metal plate.

Preferably steps f) and g) are performed multiple times alternately such that the formed sintered metal becomes thicker after every iteration.

Preferably after the last laser sintering step g), a step h) of singulation of each of the semiconductor devices is performed. Alternatively, after step g) but prior to step h) an additional step can be performed consisting of tin plating both sides of the exposed sintered metal surfaces.

Preferably the metal powder is made of particles having a diameter of 20-100 μm and preferably each layer of metal powder deposited during step a) and or step f) is one particle thick.

Preferably during steps b) and g), the metal powder is sintered at a temperature range of 170° C.-400° C. and preferably the laser is sintering with a speed of 50-250 mm/s.

BRIEF DESCRIPTION OF DRAWINGS

The disclosure will now be discussed with reference to the drawings, which show in.

DETAILED DESCRIPTION

Figure 1A:
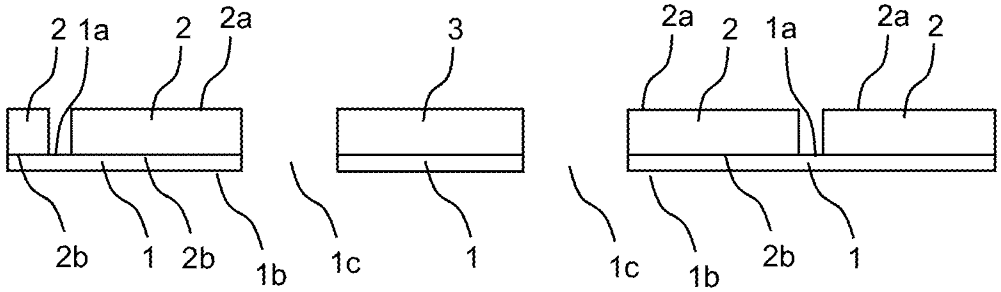
FIG. 1*a* a metal pillar and a die provided on the base layer.

For a proper understanding of the disclosure, in the detailed description below corresponding elements or parts of the disclosure will be denoted with identical reference numerals in the drawings.

Figure 2:
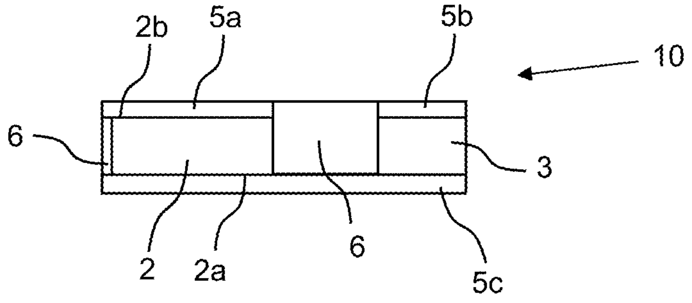
FIG. 2 a final package of a semiconductor device.

A semiconductor device package obtained with the method according to the disclosure, is depicted in FIG. 2 and denoted with reference numeral 10. In general semiconductor device package 10 comprises a metal layer 5*c*, a first metal plate 5*a*, a second metal plate 5*b*, a metal pillar 3, an encapsulant 6, and a die 2 with a first terminal 2*a* and a second terminal 2*b*. The first terminal 2*a* of the die 2 is in contact with the metal layer 5*c*. The metal pillar 3 is in contact with the metal layer 5*c*. The second terminal 2*b* of the die 2 is in contact with the first metal plate 5*a*. The metal pillar 3 is in contact with the second metal plate 5*b*. Between the die 2 and the metal pillar 3 and between the first metal plate 5*a* and the second metal plate 5*b* there is the encapsulant 6. The metal layer 5*c*, the first metal plate 5*a* and the second metal plate 5*b* are made of a sintered metal powder. It also should be clear that the die 2 is a semiconductor with at least two terminals.

The pillar 3 preferably is made of copper, silver, gold or stainless steel.

In a preferred example of the disclosure, the pillar 3 is made of a sintered metal powder. In even more preferrable example the pillar 3 is made during the same process and there is no need to provide the pillars 3 being manufactured in another process. This solution simplified the whole manufacturing process.

The metal layer 5*c*, the first metal plate 5*a* and the second metal plate 5*b* may be made of copper, copper with additives, silver, brass, aluminum, or carbon nanotubes A method of assembling a semiconductor device according to the disclosure comprises at least two steps, denoted as step a) and step b). During step a), see FIG. 1*c*, a layer of a metal powder 4 is provided on a semiconductor device assembly. The semiconductor device assembly comprises a base layer 1 having a first base layer side 1*a* and a second base layer side 1*b* and at least one perforation 1*c*. Furthermore, on the base layer 1 at least one die 2 with a first terminal 2*a* and a second terminal 2*b* is provided as well as at least one metal pillar 3. The first terminal 2*a* of the die 2 is in contact with the base layer 1. See FIG. 1*a*. The metal pillar 3 is in contact with the base layer 1 and an encapsulant 6 is provided between the metal pillar 3 and the die 2. The encapsulant 6 is also in the perforations 1*c* of the base layer 1, see FIG. 1*b*. The layer of a metal powder 4 is provided such that it is in contact with the second terminal 2*b* of the die 2, the metal pillar 3 and the encapsulant 6. During a step b) a sintering step is performed using laser light L with a laser and as a result, a metal layer 5*c* is formed during sintering of the layer of the metal powder 4 (FIG. 1*e*).

A manufacturing method as presented with the present disclosure allows to avoid the use of mainframes and/or clips and provide elements with similar function made of a sintered metal.

In preferred embodiment the steps a) and b) are performed multiple times alternately. This allows for better control of the sintering process where each sintered metal layer has the same properties. A lower power laser may be used and each sintering step b) will take shorter time with thinner layers. A formed sintered metal is thicker after every iteration.

In yet another preferred embodiment the metal pillar 3 is made during a step a0), which is performed before the step a). The layer of the metal powder 4 is provided on the base and the layer of the metal powder 4 is sintered. This step a0) is preferably performed multiple times to obtain the metal pillar 3 with a height similar to a height of the die 2.

In another preferred example, during the step b) the laser sinters the metal powder 4 such that it forms a defined pattern and after this step, a step c) is performed, during which an excessive metal powder is removed from the semiconductor device assembly. The defined pattern includes, but is not limited to, a letter, number, symbol, or a plurality and/or mix of letters, numbers and symbols, or any other pattern such as lines, dots etc. This allows in particular to provide a semiconductor details during the same process.

According to beneficial examples of the disclosure, the base layer may be a mainframe or, in another example, a carrier 1.

In yet another example, after the last step a) related to the forming of the metal layer 5*c*, a step e) is performed during which the carrier/base layer 1 is removed and the semiconductor device assembly is turned upside down. It should be noted that the carrier 1 may be removed after the semiconductor assembly has been turned upside down. The result of step e) and the turned upside down step is depicted in FIG. 1*f*.

After step e), a step f) of providing a layer of a metal powder 4 is performed, wherein the metal powder 4 is provided on the first terminal 2*a* of the die 2, on the pillar 3 and on the encapsulant 6. After this step f), a step g) is performed, during which a laser is sintering the layer of the metal powder 4 to form a first metal plate 5*a* and a second metal plate 5*b*. Steps f) and g) are depicted in FIGS. 1*g* and 1*h* and may be performed multiple times alternately such that formed sintered metal 5*a* and 5*b* becomes thicker after every iteration.

In a preferred example after the last laser sintering step, a step h) of singulation of each semiconductor device is performed. The singulating step h) may comprise a trimming step T and results in individual semiconductor device packages 10 as shown in FIGS. 1*j* and 2.

In another example the metal powder is made of particles having a diameter of 20-100 μm. During each depositing step a) and or f), each subsequent layer of metal powder 4 is preferably one particle thick.

In preferred embodiment during the steps b) and/or g) the metal powder is sintered in a temperature 170° C.-400° C. Preferably, the laser device is sintering with a speed of 50-250 mm/s.

Now, for illustrative purposes, an exemplary manufacturing process will be described with respect to FIGS. 1*a*-1*j*. All figures shows a cross-section of the assembly during the process.

Figure 1B:
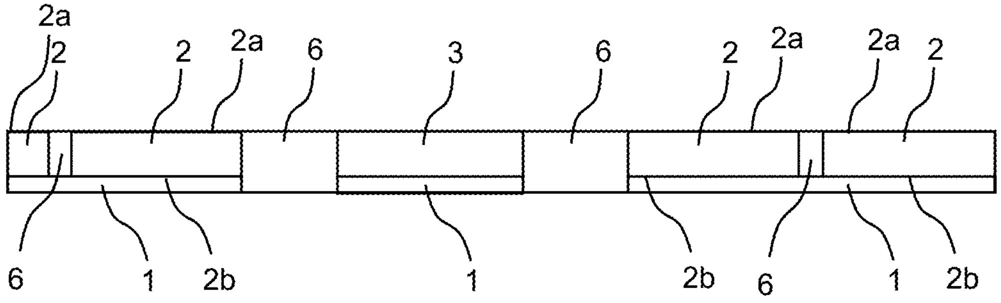
FIG. 1*b* assembled parts with an encapsulant in perforations in the base layer.
Figure 1C:
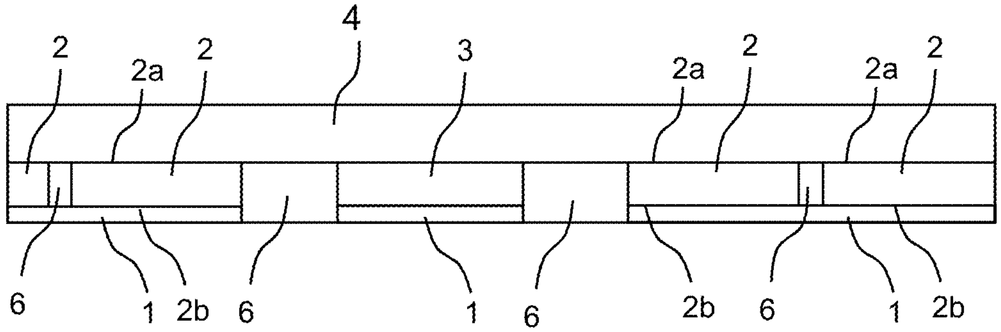
FIG. 1*c* assembled parts with a metal powder spread on top.

On FIG. 1*a* dies 2 and the pilar 3 are already placed on the carrier or base layer 1. The dies 2 are placed such that the first terminal 2*a* is in contact with the carrier/base layer 1. In all FIGS. 1*a*-1*j* a small part of a whole assembly is presented and it should be clear that there are more metal pillars 3 and dies 2 placed or positioned on the base layer 1 in an alternating manner. As may be seen the dies 2 and the metal pillar 3 are separated from each other. These spaces and perforations 1*c* in the carrier 1 will be filled with the encapsulant 6, as shown in FIG. 1*b*. In this embodiment the metal pilar 3 is made of copper.

After the encapsulation process of FIG. 1*b*, the layer of the metal powder 4, preferably composed of copper particles in this embodiment, is provided on a top side of the intermediate assembly, who is on a side away or opposite from the base layer 1, where both the metal pilar 3 and the dies 2 are visible.

Figure 1D:
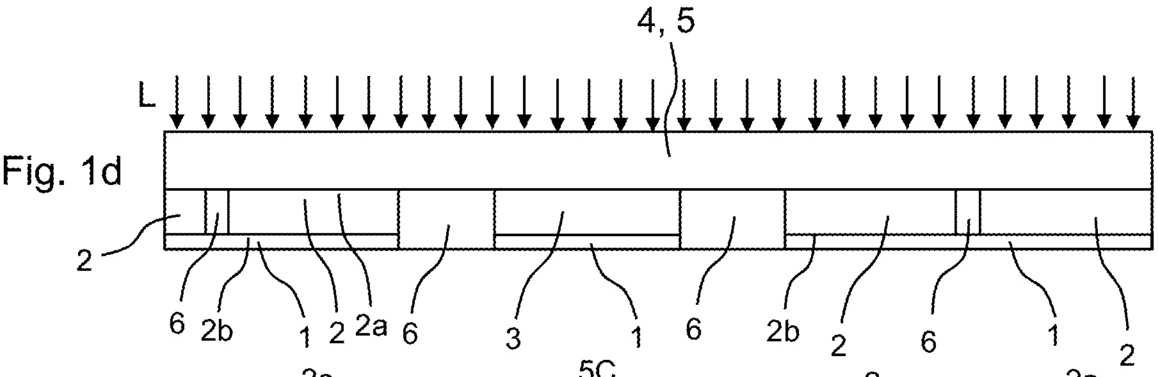
FIG. 1*d* assembled parts with the metal powder being submitted to a direct laser sintering.
Figure 1E:
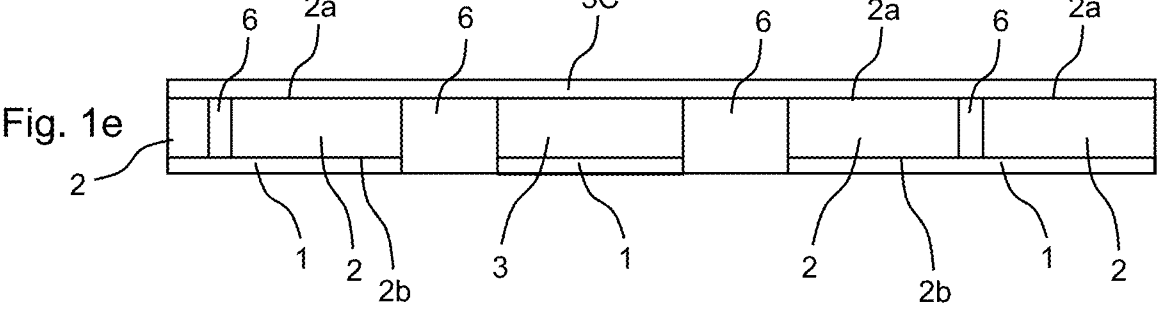
FIG. 1*e* assembled parts with a solid metal layer formed laser sintering.
Figure 1F:
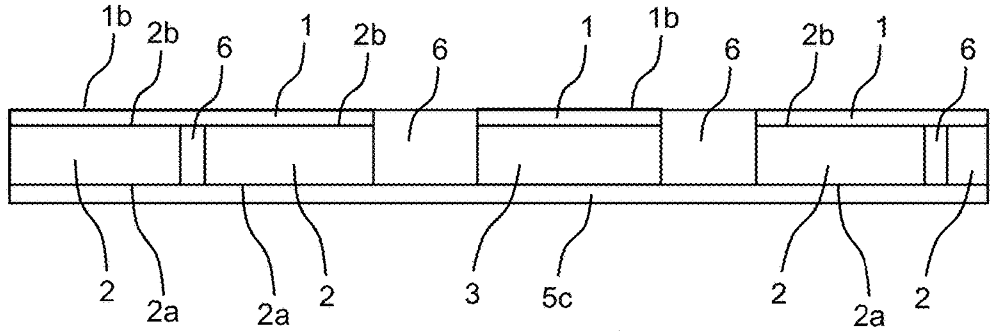
FIG. 1*f* a part turned upside down.
Figure 1G:
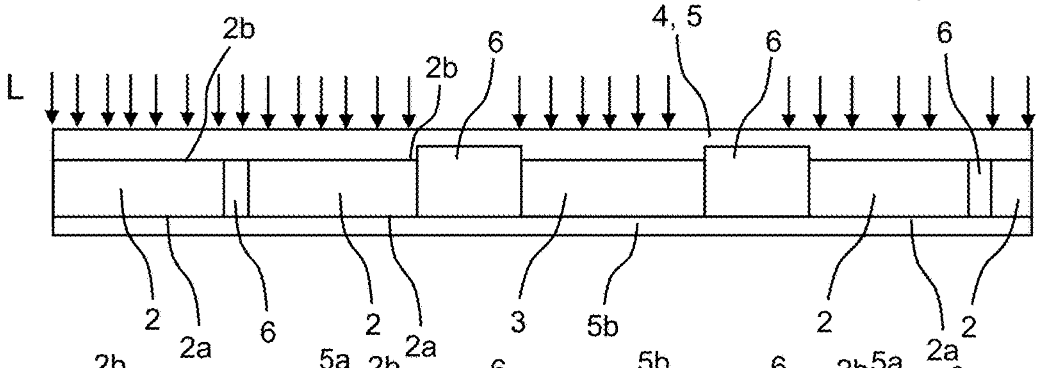
FIG. 1*g* assembled parts after removing the base with the metal powder spread and being submitted to the direct laser sintering.
Figure 1H:
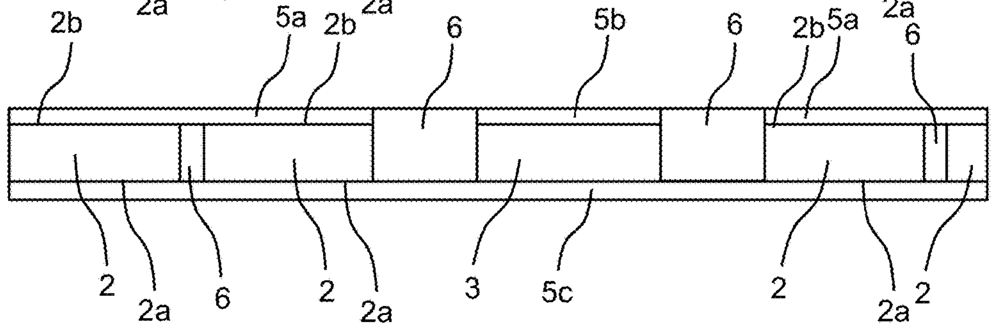
FIG. 1*h* assembled parts with a solid metal plates formed after laser sintering.
Figure 1I:
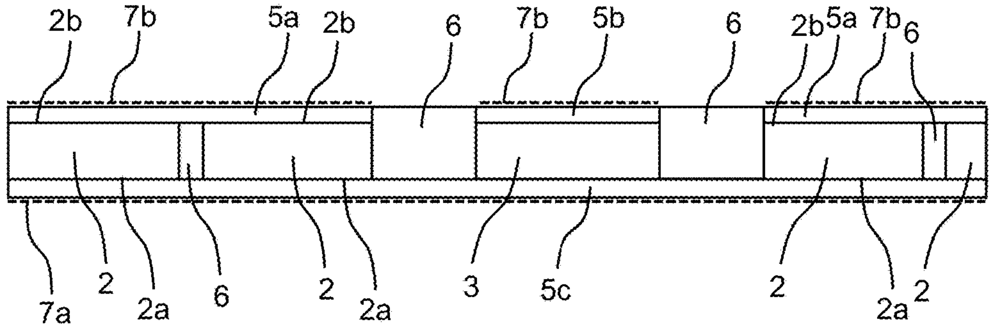
FIG. 1*i* an optional tin plating process step prior to the singulation process of FIG. 1*i*.
Figure 1J:
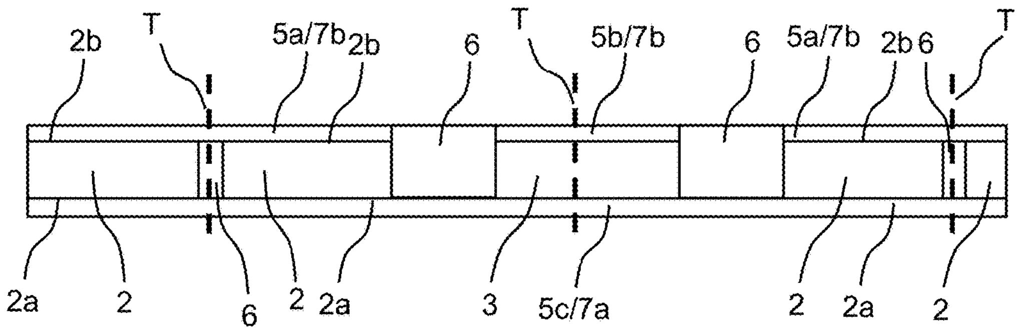
FIG. 1*j* an assembled package being submitted to singulation process.

FIG. 1*d* shows a step of sintering, where a laser light L sinters the metal powder 4. It should be noticed that the laser light may sinter smaller surface areas of the metal powder 4 and it is not necessary to sinter all metal powder 4 at once.

FIG. 1*e* shows the assembly where on a first side there is the carrier 1, on other, opposite side there is the metal layer 5*c* connecting all second terminals 2*b* of the dies 2, the encapsulant 6 and the metal pillar(s) 3.

FIG. 1*f* shows the assembly after turning it upside down. Now the carrier/base layer 1 is on top of the assembly and after a subsequent process step e) the carrier 1 is completely removed, chemically or physically, from the assembly.

FIG. 1*g* shows the assembly, where during a further step f) metal powder 4 has been provided on a top side of the assembly, which is on the side where previously the carrier 1 was present or used to be, but has been removed, during step e). The metal powder 4 is in contact with the first terminal 2*a* of the dies 2, the metal pilar 3 and the encapsulant 6. It should be noted that the encapsulant 6, after the carrier 1 has been removed, is protruding above a level of the metal pilar 3 and the dies 2. FIG. 1*g* shows, similarly to FIG. 1*d*, the sintering of the metal assembly done by the laser light L.

FIG. 1*h* shows the assembly where a metal layer is sintered on FIG. 1*g* forming the first metal plate 5*a* and the second metal plate 5*b*. In this embodiment the first metal plate 5*a* is in contact with the first terminals 2*a* of adjacent dies 2 and the second metal plate 5*b* is in contact with the metal pilar 3. Both the first metal plate 5*a* and the second metal plate 5*b* are separated from each other by a protruding portion of encapsulant 6. The person skilled in the art would know that such arrangement of the metal plates 5*a* and 5*b* depend on a particular semiconductor device project and may be changed as fit. In the present example the semiconductor device will have only two contacts in its final product, namely the first metal plate 5*a*, which is electrically connected to the first terminal 2*a* of the die 2 and the second metal plate 5*b* which is electrically connected to the metal layer 5*c* via the metal pillar 3. It should be noted that more dies, even with more terminals, and more contacts may be assembled during this process and the presented process is not limited to the semiconductor device with only one die 2 and two terminals 2*a* and 2*b*.

FIG. 1*j* shows the singulation of each semiconductor device 10 along dashed lines T. It should be understood that the assembly is a three dimension object and other cuts are made which are not presented in the figures.

Alternatively, after step g) (depicted in FIG. 1*h*) but prior to step h) (the singulation step of FIG. 1*j*) an additional step can be performed consisting of tin plating both sides of the exposed sintered metal surfaces 5*a*-5*b*-5*c*, thereby forming a thin layer of tin material. Both thin layers are denoted in an exaggerated, emphasized manner by means of the dashed lines 7*a*-7*b* in FIG. 1*i*.

FIG. 2 shows a final product which is the semiconductor assembly device or package 10. The package 10 has on one side the metal layer 5*c* connected to the first terminal 2*a* of the die 2 and the metal pillar 3, with the die 2 and the pillar 3 being separated by a portion of encapsulant 6. On the other side of the package 10 are provided the first metal plate 5*a* connected to the second terminal 2*b*, and the second metal plate 5*b* connected to the metal pillar 6. Both the first metal plate 5*a* and the second metal plate 5*b* are electrically separated from each other by means of the portion of the encapsulant 6. On the sides of the package 10, the pilar 3 and encapsulant 6 is visible/exposed. It should be noted that in this example the die 2, in the final product, is not visible.

The disclosed example of the disclosure is illustrative only and in no way limiting the disclosure as claimed.

A method based on the direct metal laser sintering overcomes the predicament of High Lead solder application in clip bonding packages. By deploying this method, dispensing/stencil print, reflow and flux cleaning process can be eliminated. The disclosure can also be applied to form interconnects using a variety of sinter-able grades of metal powder.

LIST OF REFERENCE SYMBOLS USED

1—Carrier/base layer
1*a*—First side of base layer
1*b*—Second side of base layer
2—Die
2*a*—First terminal
2*b*—Second terminal
3—Metal pillar
4—Metal powder

5—Sintered metal powder
5*a*—First metal plate
5*b*—Second metal plate
5*c*—Metal layer
6—Encapsulant
7*a*-7*b*—Thin layers of tin material
10—Semiconductor assembly device/package
L—Laser light
T—Singulation section

What is claimed is:

1. A semiconductor assembly device comprising a metal layer, a first metal plate, a second metal plate, a metal pillar, an encapsulant, and a die structure having a first terminal and a second terminal, wherein the first terminal of the die structure is in electrical contact with the metal layer, wherein the metal pillar is in electrical contact with the metal layer, wherein the second terminal of the die structure is in contact with the first metal plate and the metal pillar is in contact with the second metal plate, wherein the metal pillar has a height similar to a height of the die structure and between the die structure and the metal pillar and between the first metal plate and the second metal plate the encapsulant is provided, and wherein the metal layer, the first metal plate and the second metal plate are made of a sintered metal powder.

2. The semiconductor device according to claim 1, wherein the pillar is made of a material selected from the group consisting of copper, silver, gold and stainless steel.

3. The semiconductor device according to claim 1, wherein the pillar is made of a sintered metal powder.

4. The semiconductor device according to claim 1, wherein at least one of the metal layer, the first metal plate or the second metal plate are made of a material selected from the group consisting of copper, copper with additives, and silver.

5. The semiconductor device according to claim 2, wherein the pillar is made of a sintered metal powder.

6. The semiconductor device according to claim 2, wherein at least one of the metal layer, the first metal plate or the second metal plate are made of a material selected from the group consisting of copper, copper with additives, and silver.

7. A method of assembling a semiconductor device according to claim 1, the method comprising a sequence of steps of:

a. providing a base layer having a first base layer side and a second base layer side and at least one perforation, at least one die structure having a first terminal and a second terminal, the at least one die structure being mounted with its second terminal on the first base layer side of the base layer, and at least one metal pillar mounted on the first base layer side of the base layer and at some distance from the at least one die structure, b. providing an encapsulant material on the first base layer side and in the perforation and between the metal pillar and the at least one die structure, thereby forming an encapsulant structure, c. providing a layer of a metal powder on the encapsulant structure so that the metal powder is in contact with the first terminal of the die structure, the metal pillar and the encapsulant material;

d. sintering, with laser light radiation, the layer of the metal powder to form a metal layer.

8. The method according to claim 7, wherein steps c and d are performed multiple times alternately so that the formed sintered metal becomes thicker after every iteration.

9. The method according to claim 7, further comprising a step a0, being performed before step a, of forming the metal pillar on the first surface side of the base layer by a0-1 applying a layer of metal powder on the first surface side of the base layer, a0-2 sintering the layer of the metal powder, and a0-3 repeating sub steps a0-1 and a0-2 multiple times to obtain the metal pillar with a height similar to a height of the die structure.

10. The method according to claim 7, wherein the sintering step d comprises the step of forming the sintered metal layer into a form selected from the group consisting of a letter, a number, a symbol, and a pattern; and step d is followed by removing excessive metal powder.

11. The method according to claim 7, wherein the base layer is a mainframe.

12. The method according to claim 7, wherein the base layer is a carrier.

13. The method according to claim 8, further comprising a step a0, being performed before step a, of forming the metal pillar on the first surface side of the base layer by a0-1 applying a layer of metal powder on the first surface side of the base layer a0-2 sintering the layer of the metal powder, and a0-3 repeating sub steps a0-1 and a0-2 multiple times to obtain the metal pillar with a height similar to a height of the die structure.

14. The method according to claim 9, wherein the sintering step d comprises the step of forming the sintered metal layer into a form selected from the group consisting of a letter, a number, a symbol, and a pattern; and step d is followed by removing excessive metal powder.

15. The method according to claim 9, wherein the base layer is a mainframe.

16. The method according to claim 9, wherein the base layer is a carrier.

17. The method according to claim 16, further comprising the following steps performed after step d, of:

e. removing the base layer from the encapsulant structure;

f. turning the encapsulant structure upside down;

g. providing a layer of a metal powder on the encapsulant structure so that the metal powder is provided on the second terminal of the die structure, on the pillar and on the encapsulant; and h. sintering, with laser light radiation, the layer of the metal powder to form a first metal plate and a second metal plate.

18. The method according to claim 17, wherein step g and h are performed multiple times alternately so that the formed sintered metal becomes thicker after every iteration.

19. The method according to claim 17, further comprising the step, after the last sintering step h, of:

i. singulating each semiconductor assembly device.

20. The method according to claim 18, further comprising the step, after the last sintering step h, of:

i. singulating each semiconductor assembly device.

* * * * *